United States Patent [19]
Benke et al.

[11] Patent Number: 6,023,228
[45] Date of Patent: Feb. 8, 2000

[54] METHOD AND APPARATUS FOR CHECKING ELECTRICAL DRIVE MECHANISMS

[75] Inventors: Harald-Peter Benke, Kahl; Robert Horbach, Alzenau; Heinz Kutzer, Maintal, all of Germany

[73] Assignee: Siemens Aktiengesellschaft, Munich, Germany

[21] Appl. No.: 09/088,292

[22] Filed: Jun. 1, 1998

Related U.S. Application Data

[63] Continuation of application No. PCT/DE96/02178, Nov. 15, 1996.

[30]     Foreign Application Priority Data

Nov. 30, 1995  [DE]   Germany ............................ 195 44 565

[51] Int. Cl.$^7$ .................................................. G08B 21/00
[52] U.S. Cl. ......................... 340/635; 340/635; 340/661
[58] Field of Search ................................... 340/635, 657, 340/660, 661, 648, 638; 371/37.9, 37.8; 361/93, 94; 395/183.01

[56]           References Cited

U.S. PATENT DOCUMENTS

| | | | |
|---|---|---|---|
| 2,173,123 | 9/1939 | McDonald | 340/635 |
| 4,149,160 | 4/1979 | Bozarth et al. | 340/661 |
| 4,366,474 | 12/1982 | Loewenstein | 340/661 |
| 4,977,390 | 12/1990 | Saylor et al. | 340/635 |
| 5,050,823 | 9/1991 | Parker | 246/5 |
| 5,315,256 | 5/1994 | Schuyler | 340/661 |
| 5,506,572 | 4/1996 | Hills et al. | 340/635 |
| 5,623,254 | 4/1997 | Brambilla et al. | 340/635 |

FOREIGN PATENT DOCUMENTS

| | | |
|---|---|---|
| 0625710A2 | 11/1994 | European Pat. Off. . |
| 0609261B1 | 10/1995 | European Pat. Off. . |
| 3105591A1 | 1/1982 | Germany . |
| 2122749 | 1/1984 | United Kingdom . |

OTHER PUBLICATIONS

"Mikroelektronik in der Energietechnik" (microeletronics in the energy technology), VDE–Verlag GmbH, D. Oeding, Darmstadt, pp. 22–41.

Published International Patent Application No. 93/08482 (Kutzer), dated Apr. 29, 1993.

Published International Patent Application No. 93/23760 (Swindler), dated Nov. 25, 1993.

*Primary Examiner*—Jeffery A. Hofsass
*Assistant Examiner*—John Tweel, Jr.
*Attorney, Agent, or Firm*—Herbert L. Lerner; Laurence A. Greenberg

[57]           ABSTRACT

A method and an apparatus are provided for checking a plurality of electrical drive mechanisms which may, in particular, be drive mechanisms for railroad switches. Measured values are picked up at the same time at the plurality of electrical drive mechanisms, and the signals describing them are provided with a drive mechanism-specific identifier. These thus-identified signals are then carried without interruption, on-line, to a data processing system, where they are compared with desired values that are available there. If a signal deviates from a desired value, an error is indicated for the particular drive mechanism at which the signal originated.

15 Claims, 1 Drawing Sheet

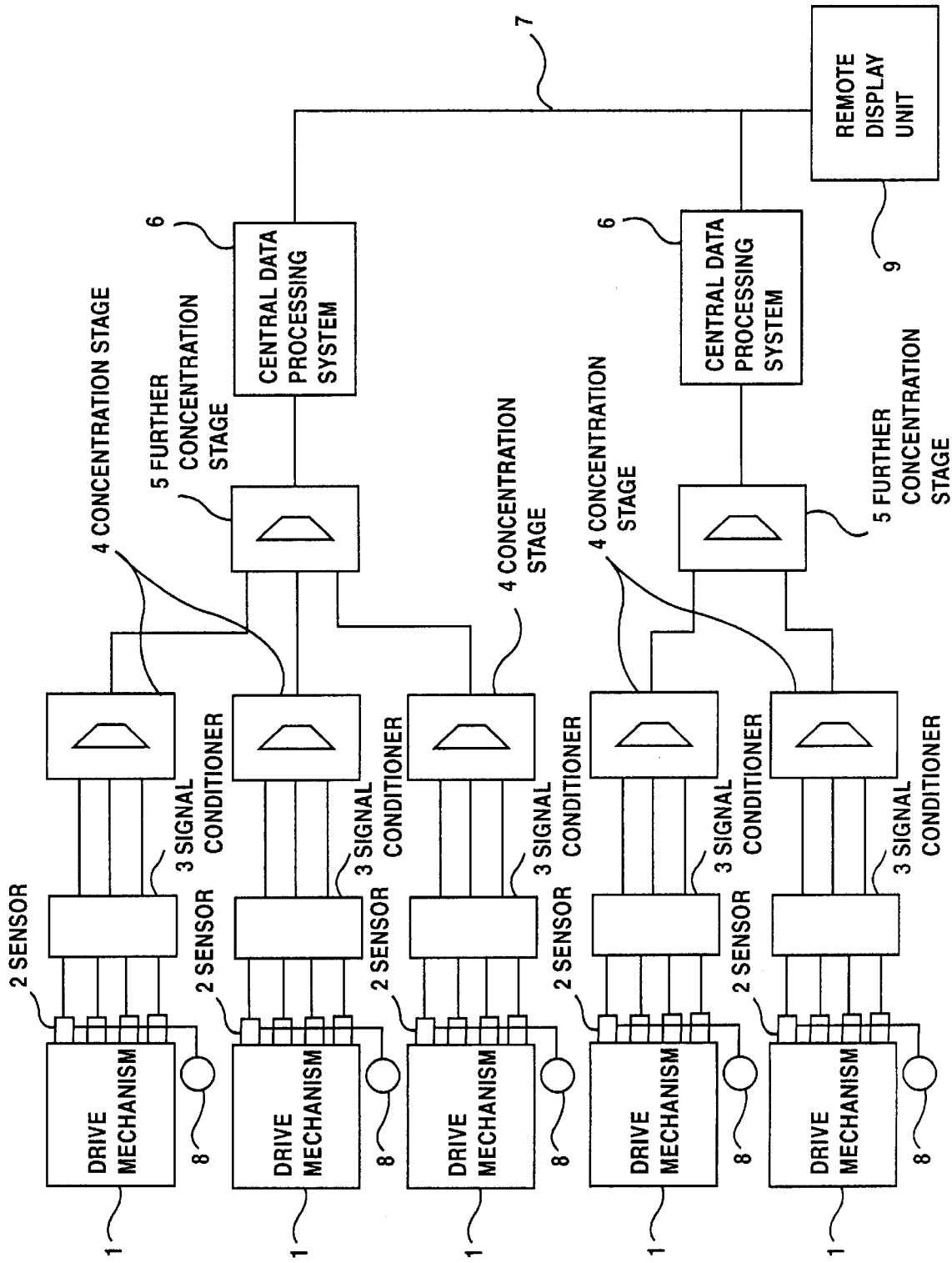

METHOD AND APPARATUS FOR CHECKING ELECTRICAL DRIVE MECHANISMS

CROSS-REFERENCE TO RELATED APPLICATION

This application is a continuation of International Application No. PCT/DE96/02178, filed Nov. 15, 1996, which designated the United States.

BACKGROUND OF THE INVENTION

FIELD OF THE INVENTION

The invention relates to a method for checking electrical drive mechanisms, especially motor or magnetic drive mechanisms of fittings, final control elements, power contactors or relays, in which a measured value is picked up at a drive mechanism and a signal describing the measured value is output, the signal is compared with a desired value, and an error is indicated if there is a deviation of the signal from the desired value. The invention also relates to an apparatus for performing such a method.

Until now, when checking a plurality of electrical drive mechanisms, it has been conventional to check each of the drive mechanisms individually. To that end, often every drive mechanism to be checked was disconnected from its circuit and connected successively, one at a time, to a separate test circuit. Thus checking a large number of electrical drive mechanisms took a great deal of time.

In an apparatus for checking an electrical drive mechanism which is known from European Patent 0 609 261 B1, corresponding to U.S. Pat. No. 5,638,051, the usual operation of the drive mechanism need not be interrupted during the checking process. Each drive mechanism is connected individually to an evaluation unit, through a diagnostic connector, for the purpose of checking. A polarization pickup on a plug-in module of the drive mechanism serves merely to tell which plug-in module the diagnostic connector is connected to. Only one drive mechanism can be checked at a time with one evaluation unit. Checking a plurality of drive mechanisms simultaneously requires of a plurality of identical versions of the known apparatuses.

SUMMARY OF THE INVENTION

It is accordingly an object of the invention to provide a method and an apparatus for checking a plurality of electrical drive mechanisms, which overcome the hereinaforementioned disadvantages of the heretofore-known methods and apparatuses of this general type and which make it possible to check a large number of electrical drive mechanisms within a short period of time at little effort or expense.

With the foregoing and other objects in view there is provided, in accordance with the invention, a method for checking a plurality of electrical drive mechanisms, especially motor or magnetic drive mechanisms of fittings, final control elements, power contactors or relays, which comprises picking up measured values at a plurality of electrical drive mechanisms and outputting signals describing the measured values; providing the signals describing the measured values with drive mechanism-specific identifiers; then carrying the signals without interruption, on-line, to a central or higher-ranking data processing system; comparing the signals in the data processing system with desired values available in the data processing system; and indicating an error for a particular drive mechanism at which a signal originated if the signal deviates from its desired value.

Thus the signals themselves are provided with drive mechanism-specific identifiers. As a result, it is advantageously possible to learn in which drive mechanism an error has occurred, with only one central or higher-ranking data processing system. In particular, an advantage which is attained is that all of the drive mechanisms can be checked at the same time because the sensors of all of the drive mechanisms are connected on-line to the data processing system. No diagnostic connectors that would have to be unplugged from one drive mechanism and plugged into another are required.

Another advantage that is attained is that while all of the existing drive mechanisms can be in operation, it is possible to tell on-line, with only a single data processing system, whether one or more drive mechanisms is not meeting the specifications. In such a case, it is moreover possible to learn reliably which drive mechanism or drive mechanisms are involved.

In accordance with another mode of the invention, the measured values are picked up by sensors which are associated with power circuits and/or control circuits of the drive mechanisms. In this way, measured values are ascertained that provide information on the status of the applicable drive mechanism.

In accordance with a further mode of the invention, the signals are conditioned before they are carried to the data processing system. This means that other physical variables are calculated and furnished as signals from the signals that represent certain physical variables. The conditioning can be carried out by digital or analog measures.

In accordance with an added mode of the invention, in order to be able to link a plurality of signals, signals that arrive earlier are buffer-stored in the conditioning operation, and from them and other signals that arrive later, new signals can be formed that describe the physical variables that have not been measured. Since a new signal is determined from at least two original signals, the number of data that must be carried to the central or higher-ranking data processing system is advantageously reduced, without any loss in reliability of the method. After conditioning, it is possible to check the effective power, for instance, instead of the voltage and the current intensity. The temperature dependency can also be taken into account for a physical variable.

In accordance with an additional mode of the invention, the conditioned signals are, for instance, carried to the central or higher-ranking data processing system through a digital or hybrid network. This assures fast transmission.

In accordance with yet another mode of the invention, the conditioned signals are first concentrated, and only then are they subjected to central data processing in the data processing system. Such concentration provides that a distinction is made among the signals that are present in accordance with their significance, and that only those signals that provide good information for checking the drive mechanisms are sent on to the central or higher-ranking data processing system.

This has the advantage of permitting the number of signals that must be processed in the central or higher-ranking data processing system to be kept very low, without any sacrifice in reliability in terms of checking the drive mechanisms.

The method of the invention attains the advantage of permitting numerous drive mechanisms to be reliably checked simultaneously, on-line, at little technological effort or expense.

With the objects of the invention in view there is also provided an apparatus for checking a plurality of electrical drive mechanisms, especially motor or magnetic drive mechanisms of fittings, final control elements, power contactors or relays, comprising sensors disposed at a plurality of electrical drive mechanisms for picking up measured values and outputting signals describing the measured values; drive mechanism-specific marking devices associated with the sensors for providing the signals with drive mechanism-specific identifiers; a central or higher-ranking data processing system connected on-line to the sensors for receiving the signals without interruption, the data processing system having a comparator for comparing the signals output by the sensors with desired values available in the data processing system; and a display device connected to the data processing system for indicating an error for a particular drive mechanism at which a signal originated if the signal deviates from its desired value.

This apparatus attains the advantage of permitting a plurality of drive mechanisms to be checked on-line at the same time with one central or higher-ranking data processing system, since the signals that originate at the sensors are identified by the marking devices in such a way that they can be reliably associated with a particular drive mechanism.

In accordance with another feature of the invention, the sensors communicate with the data processing system through at least one digital or analog signal conditioner. This has the advantage of permitting the number of signals that have to be processed to be reduced, because a new signal that furnishes at least as much information about the status of the drive mechanism as the original signals is calculated in a signal conditioner, from at least two original signals.

In accordance with a further feature of the invention, each signal conditioner includes a memory and a central processor. The memory is necessary because the signals to be linked together are not all present at the same time. The signal that arrives first must therefore be buffer- stored first.

In accordance with an added feature of the invention, the sensors communicate with the data processing system through a concentration stage. There, only those signals that are absolutely required to assess the status of the electrical drive mechanism are selected from the many signals that may have already been conditioned. This has the advantage of ensuring that even fewer signals than would otherwise be typical need to be carried to the data processing system.

In accordance with a concomitant feature of the invention, the sensors communicate with the central or higher-ranking data processing system through a digital or hybrid network, which makes reliable signal transmission possible.

With the apparatus of the invention, as with the method, an advantage which is attained is that a plurality of drive mechanisms can be simultaneously monitored and checked on-line by simple measures and the operation of the drive mechanisms to be checked need not be stopped for the checking operation. This can be carried out by simple measures.

Other features which are considered as characteristic for the invention are set forth in the appended claims.

Although the invention is illustrated and described herein as embodied in a method and an apparatus for checking electrical drive mechanisms, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a block circuit diagram illustrating a method and an apparatus according to the invention for checking electrical drive mechanisms.

DESCRIPTION OF THE PREFERRED EMBODIMENTS

Referring now in detail to the single FIGURE of the drawing, there is seen a commercial-scale system in which there are numerous drive mechanisms 1, the operability of which must be checked regularly. These drive mechanisms may be electrical or electromagnetic drive mechanisms. If the drive mechanisms are motor or magnetic drive mechanisms, they can be connected to fittings, valves, control valves, solenoid valves, final control elements, power contactors and/or electrical relays. Such fittings and so forth are often present in power plants or industrial systems. The aforementioned final control elements may in particular be railroad switches, the operability of which must be checked regularly, to assure safe railroad operation.

Each electrical drive mechanism 1 is assigned a plurality of sensors 2 for picking up various measured values and outputting signals that identify the measured values. The measured values may, for instance, be current intensity, voltage, temperature, and so forth. Each sensor 2 communicates on the output side with a signal conditioner 3. Such a signal conditioner 3 may include a memory and a central processor, which are not shown. In the signal conditioner 3, two or more signals are used to form another signal that represents another physical variable. In this way, the number of signals is reduced without any loss of information. The signal conditioner 3 of a drive mechanism 1 communicates on the output side with a concentration stage 4. There, only those signals that allow especially reliable detection of the status of a drive mechanism 1 are selected from the arriving signals. The number of signals that have to be evaluated is advantageously reduced even further thereby. One further concentration stage 5 is present, which reduces the number of signals even further, for a group of a plurality of drive mechanisms 1. The further concentration stage 5 is connected on the output side to a central data processing system 6. There, desired values are already stored in memory, and the arriving signals are compared with them. If any deviations are ascertained, a signal is output to a remote display unit 9 or to a non-illustrated control unit, through a connected network 7. If there is no further concentration stage 5, then the concentration stages 4 can be connected directly to the data processing system 6.

It is also possible for only a single data processing system 6 to be associated with a plurality of concentration stages 5. If only one data processing system is needed for all of the drive mechanisms 1, then this system can also be located at the site of the display unit 9 or control unit.

The sensors 2 are connected to marking devices 8, which assign drive mechanism-specific identifiers, symbols or codes to the signals. With the aid of these identifiers, it is possible to unambiguously ascertain in the central or higher-ranking data processing system 6 which drive mechanism 1 is not meeting its specifications, if a conditioned signal that has also been selected by a concentration stage 4 deviates from the desired value.

A plurality of drive mechanisms can be checked for operability, during operation.

We claim:

1. A method for checking a plurality of electrical drive mechanisms, which comprises:
   picking up measured values at a plurality of electrical drive mechanisms and outputting signals describing the measured values;
   providing the signals describing the measured values with drive mechanism-specific identifiers;
   then carrying the signals without interruption, on-line, to a central or higher-ranking data processing system;
   comparing the signals in the data processing system with desired values available in the data processing system; and
   indicating an error for a particular drive mechanism at which a signal originated if the signal deviates from its desired value.

2. The method according to claim 1, which comprises picking up the measured values at motor drive mechanisms of devices selected from the group consisting of fittings, final control elements, power contactors and relays.

3. The method according to claim 1, which comprises picking up the measured values at magnetic drive mechanisms of devices selected from the group consisting of fittings, final control elements, power contactors and relays.

4. The method according to claim 1, which comprises carrying out the step of picking up the measured values with sensors associated with at least one of power circuits and control circuits of the drive mechanisms.

5. The method according to claim 1, which comprises conditioning the signals before the signals are carried to the data processing system.

6. The method according to claim 5, which comprises carrying out the conditioning step by buffer-storing the signals, calculating physical variables that have not been measured from the buffer-stored signals and other signals, and supplying new signals describing them.

7. The method according to claim 1, which comprises carrying the signals through a digital or hybrid network to the data processing system.

8. The method according to claim 5, which comprises concentrating the conditioned signals before carrying the conditioned signals to the data processing system.

9. An apparatus for checking a plurality of electrical drive mechanisms, comprising:
   sensors disposed at a plurality of electrical drive mechanisms for picking up measured values and outputting signals describing the measured values;
   drive mechanism-specific marking devices associated with said sensors for providing the signals with drive mechanism-specific identifiers;
   a central or higher-ranking data processing system connected on-line to said sensors for receiving the signals without interruption, said data processing system having a comparator for comparing the signals output by said sensors with desired values available in said data processing system; and
   a display device connected to said data processing system for indicating an error for a particular drive mechanism at which a signal originated if the signal deviates from its desired value.

10. The apparatus according to claim 9, wherein said sensors pick up measured values of motor drive mechanisms selected from the group consisting of fittings, final control elements, power contactors and relays.

11. The apparatus according to claim 9, wherein said sensors pick up measured values of magnetic drive mechanisms selected from the group consisting of fittings, final control elements, power contactors and relays.

12. The apparatus according to claim 9, including at least one signal conditioner connected between said sensors and said data processing system.

13. The apparatus according to claim 12, wherein said at least one signal conditioner includes a memory and a central processor.

14. The method according to claim 9, including a concentration stage connected between said sensors and said data processing system.

15. The method according to claim 9, including a digital or hybrid network connected between said sensors and said data processing system.

* * * * *